US006798362B2

(12) United States Patent
Modha

(10) Patent No.: US 6,798,362 B2
(45) Date of Patent: Sep. 28, 2004

(54) POLYNOMIAL-TIME, SEQUENTIAL, ADAPTIVE SYSTEM AND METHOD FOR LOSSY DATA COMPRESSION

(75) Inventor: Dharmendra Shantilal Modha, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/285,131

(22) Filed: Oct. 30, 2002

(65) Prior Publication Data

US 2004/0085228 A1 May 6, 2004

(51) Int. Cl.[7] .................................................. H03M 7/34
(52) U.S. Cl. .......................................... 341/51; 341/50
(58) Field of Search ............................. 341/51, 50, 67; 382/40; 704/260

(56) References Cited

U.S. PATENT DOCUMENTS

| | | | | |
|---|---|---|---|---|
| 4,698,751 | A | * 10/1987 | Parvin | 712/19 |
| 4,994,966 | A | 2/1991 | Hutchins | 364/419 |
| 5,006,849 | A | 4/1991 | Baarman et al. | 341/95 |
| 5,109,433 | A | 4/1992 | Notenboom | 382/40 |
| 5,299,125 | A | 3/1994 | Baker et al. | 364/419.08 |
| 5,384,893 | A | 1/1995 | Hutchins | 395/2.76 |
| 5,412,384 | A | 5/1995 | Chang et al. | 341/79 |
| 5,534,861 | A | 7/1996 | Chang et al. | 341/79 |
| 5,832,432 | A | 11/1998 | Trader et al. | 704/260 |
| 5,836,003 | A | * 11/1998 | Sadeh | 341/51 |
| 5,893,102 | A | 4/1999 | Maimone et al. | 707/101 |
| 5,951,623 | A | 9/1999 | Reynar et al. | 708/203 |
| 6,018,303 | A | * 1/2000 | Sadeh | 341/51 |
| 6,218,970 | B1 | 4/2001 | Jaquette | 341/106 |

FOREIGN PATENT DOCUMENTS

JP     11252569 A    9/1999    ............ H04N/7/32

OTHER PUBLICATIONS

R. Zamir et al., "Towards Lossy Lempel–Ziv: Natural Type Selection," Dept. of Elect. & Comp. Eng., University of California, Santa Barbara, CA.

(List continued on next page.)

Primary Examiner—Brian Young
Assistant Examiner—Joseph Lauture
(74) Attorney, Agent, or Firm—Samuel A. Kassatly

(57) ABSTRACT

A system and method are provided for lossy compression of finite alphabet source sequences subject to an average-per-letter distortion constraint. The source sequence is sequentially parsed into phrases and each source phrase is mapped to a distorted phrase such that average per-letter distortion between the two phrases does not exceed the desired distortion. The present system adaptively maintains a codebook as the collection of all one-letter extensions of previously emitted distorted phrases. The present system uses approximate string matching and carries out a sequential procedure by iterating the following steps: (i) given the current codebook find the longest source phrase that can be transmitted at a given distortion, (ii) from all codewords that match the source phrase carefully choose that which is most likely to be useful in the future. For every new source phrase, the present system judiciously selects one of the many approximately matching codewords to balance between the code rate for the current phrase versus the code rate from resulting codebooks for the future source phrases. The present system outputs a distorted sequence that can be naturally losslessly compressed using the Lempel-Ziv algorithm or any variation thereof. Such judicious codeword selection is intended to iteratively improve the codebook quality. The entire present sequence can be implemented in quadratic-time in the length of the source sequence. The present system is sequential and adaptive.

60 Claims, 5 Drawing Sheets

OTHER PUBLICATIONS

Y. Kochman et al., "Adaptive Parametric Vector Quantization By Natural Type Selection," Proceedings of the Data Compression Conference, Jan. 11, 2002.

Kar–Ming Cheung, et al., "A Locally Adaptive Source Coding Scheme," Communication, Control, and Signal Processing, 1990, pp. 1473–1482.

M. Atallah, et al., "A Pattern Matching Approach to Image Compression," Department of Computer Science, Purdue University, IN.

T. Berger, et al., "Lossy Source Coding," IEEE Transactions on Information Theory, vol. 44, No. 6, Oct. 1998, pp. 2693–2723.

* cited by examiner

POLYNOMIAL-TIME, SEQUENTIAL, ADAPTIVE SYSTEM AND METHOD FOR LOSSY DATA COMPRESSION

FIELD OF THE INVENTION

This invention generally relates to a system and method for lossy data compression. More particularly, this invention relates to a system that, given a source sequence drawn from a source alphabet, finds a distorted sequence drawn from a reproduction alphabet. The distorted sequence has the same length as the source sequence and is highly compressible, and does not differ from the source sequence more than a certain specified distortion level.

BACKGROUND OF THE INVENTION

Lossy data compression algorithms are of significant academic and commercial interest owing to broadband applications such as streaming multimedia, images, audio, cellular voice, and text, and may also be useful in discrete filtering of noisy finite alphabet sequences. At issue is the transmission of a binary sequence from a source to a destination. If the sequence has redundancy, a compressed version of the sequence can be transmitted. The redundant portions of the binary sequence can be recovered at the destination with no loss in data; this approach is referred to as "lossless compression".

When processing lossless compression, the amount of compression achieved is limited by the redundancy in the sequence. For large sequences such as those derived from images, the compressed version is often too large to store or transmit. To increase the compression ratio, errors may be introduced intentionally to increase the redundancy in the sequence. The destination must be willing to tolerate the distorted sequence.

Given a source sequence drawn from a source alphabet, the problem is to find a distorted sequence, of the same length as the source sequence, that is drawn from a reproduction alphabet, such that the latter sequence is highly compressible. The resulting distorted sequence is subject to the constraint that it does not differ from the former sequence by more than a certain specified distortion level, D.

The problem of lossy data compression at a fixed distortion level is summarized as follows. Given a finite string $X_1^n = X_1, X_2, \ldots, X_n$ of length n drawn from a finite source alphabet B, a distorted or lossy version of $X_1^n$ is desired, for example $Y_1^n = Y_1, Y_2, \ldots, Y_n$, that is drawn from a finite reproduction alphabet $\hat{B}$. The average single-letter distortion between the two strings is at most D (according to some bounded, non-negative distortion measure d) and the lossy sequence $Y_1^n$ is highly compressible.

In addition, the transmission rate must be minimized, where the transmission rate is the rate at which the lossy sequence $Y_1^n$ must be transmitted subject to the distortion constraint. The central result of rate-distortion theory is that for source sequences generated by a stationary, ergodic stochastic process, asymptotically (as n→∞), the rate-distortion function R(D) is an achievable lower bound on the compression rate. The main problem in lossy coding is finding practical codes that asymptotically achieve the rate-distortion bound.

A code is asymptotically optimal if it achieves the rate-distortion bound as n→∞. A code is universal if it is asymptotically optimal for a class of sources without any a priori knowledge of which specific source in the class generated the given source sequence that is to be compressed. Roughly, a code is sequential or online if its encoding delay is O(n), where n is the length of the source string compressed so far.

Sequential codes have many practical applications, especially in streaming multi-media. A sequential code is adaptive if no codebook (or other information) must be transmitted separately by the encoder to the decoder. In other terms, an adaptive code builds its codebook "on the fly" in response to an observed source sequence. Moreover, both the encoder and decoder can keep updating their codebooks by the same rule. Also of interest in solving the lossy data compression problem are polynomial-time algorithms with computational complexity of the form $O(n^k)$ for some k.

The goal of lossy source coding is to find a universal (for stationary, ergodic sources), sequential, adaptive, and polynomial-time algorithm. The quest for such an algorithm is important in theory as well in practice. When no distortion is desired, that is, D=0, the lossy coding problem simplifies to the problem of lossless data compression. In this case, the rate-distortion function coincides with the entropy rate of the source.

Various well-known algorithms for lossless coding are dynamic Huffman coding, arithmetic coding, Lempel-Ziv algorithms, and locally adaptive schemes. In particular, these algorithms present universal (for stationary, ergodic sources), sequential, adaptive, and polynomial-time algorithms for lossless data compression. These algorithms and their variants have had a significant practical and theoretical influence on the field of lossless data compression.

In contrast to lossless data compression, when the maximum average single-letter distortion between the two strings is such that specified distortion level, D is greater than zero (D>0), no algorithm attaining all the desiderata has been developed. Low computational complexity has been achieved only at the expense of yielding a non-optimal distortion. In addition, all universal lossy coding schemes found thus far lack the relative simplicity that imbues Lempel-Ziv coders and arithmetic coders with economic viability.

Exemplary lossy coding schemes will now be reviewed. Move-to-front algorithms have been extended to lossy source coding but give no performance guarantees. An on-line lossy coding algorithm has been proposed for the fixed-rate case that is universal for memoryless sources. Similar to locally adaptive schemes for lossless compression, this approach uses a "gold-washing" mechanism for promoting frequently used code words to permanent status (during a time interval of specified length) while randomly generating new candidate code words. Variations of this method have been shown to be universal for certain phi-mixing sources.

Other lossy coding schemes focus on lossy extensions of the Lempel-Ziv algorithm. In these schemes, the central idea is to use approximate string matching instead of exact string matching used in the Lempel-Ziv algorithms. The Lempel-Ziv algorithm has been extended, but without performance guarantees. In addition, the fixed-database version of the Lempel-Ziv algorithm has been considered but only sub-optimal performance guarantees could be obtained.

The mismatch between the distribution generating and fixed database (the so-called training sequence) and the optimal reproduction distribution causes the fixed-database version of the Lempel-Ziv algorithms to be sub-optimal. In response, a Lempel-Ziv-type scheme has been devised such that instead of a single fixed database, multiple databases (each drawn according to a different reproduction distribution) are used at the encoder and must also be known to the decoder. The major limitation of this algorithm is that when the reproduction alphabet is large, the number of training databases is unreasonably large.

A natural type selection scheme has been proposed using string matching for finding the type of the optimal reproduction distribution. This procedure can be thought of as a stochastic simulation of the Arimoto-Blahut algorithm for computing the rate-distortion function. A Lempel-Ziv-type algorithm for lossy compression has also been proposed. From the multiple code words that may match a source word, this algorithm chooses one "at random."

Along a different line, Lempel-Ziv-type codes that are universal (for stationary, ergodic sources and for individual sequences), but not sequential, adaptive, or polynomial-time have also been proposed. A fixed-slope universal lossy coding scheme has also been devised that searches for the reproduction sequence through a trellis in a fashion reminiscent of the Viterbi algorithm. The trellis structure allows computationally efficient heuristic codes that are also sequential in nature. However, finding the optimal reproduction sequence still takes exponential-time, rendering this approach computationally intractable.

Therefore, what is needed is a system and associated method that finds a highly compressible distorted sequence with an average per-letter distortion that does not exceed the specified distortion level D. The system and method should be computationally tractable with a high level of performance guarantee. The need for such system and method has heretofore remained unsatisfied.

SUMMARY OF THE INVENTION

The present invention satisfies this need, and presents a system and associated method (collectively referred to herein as "the system" or "the present system") for polynomial-time, sequential, adaptive algorithm for lossy data compression. The present system outputs a distorted sequence that can be naturally losslessly compressed using, for example, the Lempel-Ziv (LZ78) algorithm, or any variation thereof.

Additionally, the present system offers various refinements and extensions of the Lempel-Ziv algorithm. The present system carries out a judicious minimization procedure to select the code word of the most appropriate type, using approximate string matching.

The present system sequentially parses the source sequence into phrases and then iteratively maps each source phrase to a distorted phrase until the source sequence is exhausted. The mapping is performed such that the average per-letter distortion between the two phrases does not exceed the desired distortion. In addition, the present system adaptively maintains a codebook, or dictionary, as the collection of all one-letter extensions of all previously emitted distorted phrases.

A sequential alternative minimization procedure is implemented by iterating between the following steps:

given the current codebook, find the longest source phrase that matches at least one of the phrases in the codebook subject to the distortion constraint; and choose from all code words that match the source phrase, the code word most likely to be useful in the future.

An aspect of the present system is based on the observation that in the first step typically more than one phrase from the codebook will match the source phrase. From these competing phrases, the present system selects, in the second step, the distorted phrase that creates the least typical source phase when the source phrase is conditioned on the distorted phrase.

The present system offers numerous advantages, among which are the following: it is quadratic-time in the length of the source sequence; it is completely sequential or online; and it is adaptive in that it generates and continually grows the codebook "on-the-fly" in response to the observed source sequence without any a priori knowledge of the source. To implement this computation, the present system relies on the Lempel-Ziv algorithm for compression with side information. Such judicious selection is intended to iteratively improve the codebook quality, resulting in an algorithm that is relatively simple, elegant, and natural.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

DETAILED DESCRIPTION OF PREFERRED EMBODIMENTS

The following definitions and explanations provide background information pertaining to the technical field of the present invention, and are intended to facilitate the understanding of the present invention without limiting its scope:

Adaptive: A priori knowledge of the original version of a distorted sequence is not required by the present system to decode the distorted sequence. In the absence of a code or other information, the present system decodes the distorted sequence "on-the-fly" in response to an observed source sequence.

Polynomial-Time: If the length of source sequence X to be compressed is n, then the lossy encoder will output the distorted sequence Y in time $n^k$, where k is a constant. In a preferred embodiment, k=2 and the total encoding complexity is $O(n^2)$.

Sequential: The encoder processes phrase 1 then outputs phrase 1 distorted; continues to phrase 2 and outputs phrase 2 distorted, and so forth. If l number of phrases are processed or output, the length of the next phrase to be processed is negligible compared to the total length of all the phrases already processed.

Figure 1:
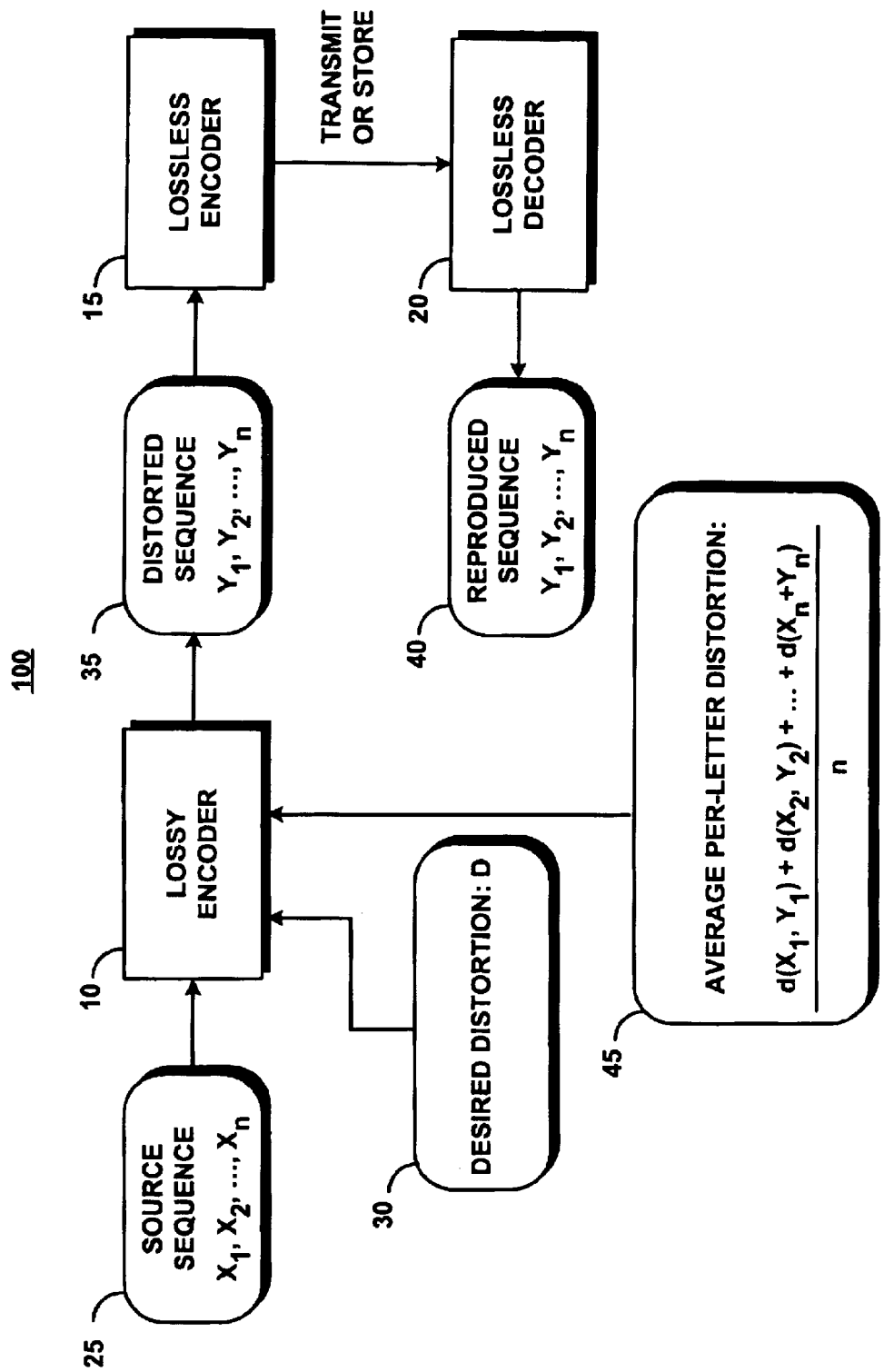
FIG. 1 is a high-level block diagram of a system comprising a lossy encoder of the present invention.

FIG. 1 illustrates an exemplary high-level architecture of a compression system 100 comprising a lossy encoder 10 that utilizes a polynomial-time, sequential, adaptive algorithm for lossy data compression. Encoder 10 includes a software programming code or computer program product that is typically embedded within, or installed on a computer. Alternatively, encoder 10 can be saved on a suitable storage medium such as a diskette, a CD, a hard drive, or like devices.

Encoder 10 operates in conjunction with a lossless encoder 15 and a lossless decoder 20. Input to encoder 10 is a source sequence 25 of length n and an allowable distortion budget, D, for a desired distortion 30. The source sequence 25 is drawn from an alphabet referred to herein as the source alphabet. Encoder 10 calculate a distorted sequence 35, such that:

the distorted sequence 35 is highly compressible; and
the average per-letter distortion 45 between the distorted sequence 35 and the source sequence 25 does not exceed the allowable distortion budget D 30.

The distorted sequence 35 is compressed then transmitted from the lossless encoder 15 to the lossless decoder 20. The output of the lossless decoder 20 is the reproduced sequence 40, that is a reproduction of the distorted sequence 25. The distorted sequence 35 is drawn from an alphabet called the reproduction alphabet. The source and reproduction alphabets are not limited to the standard Latin alphabet, and any abstract alphabet can be used.

Figure 2:
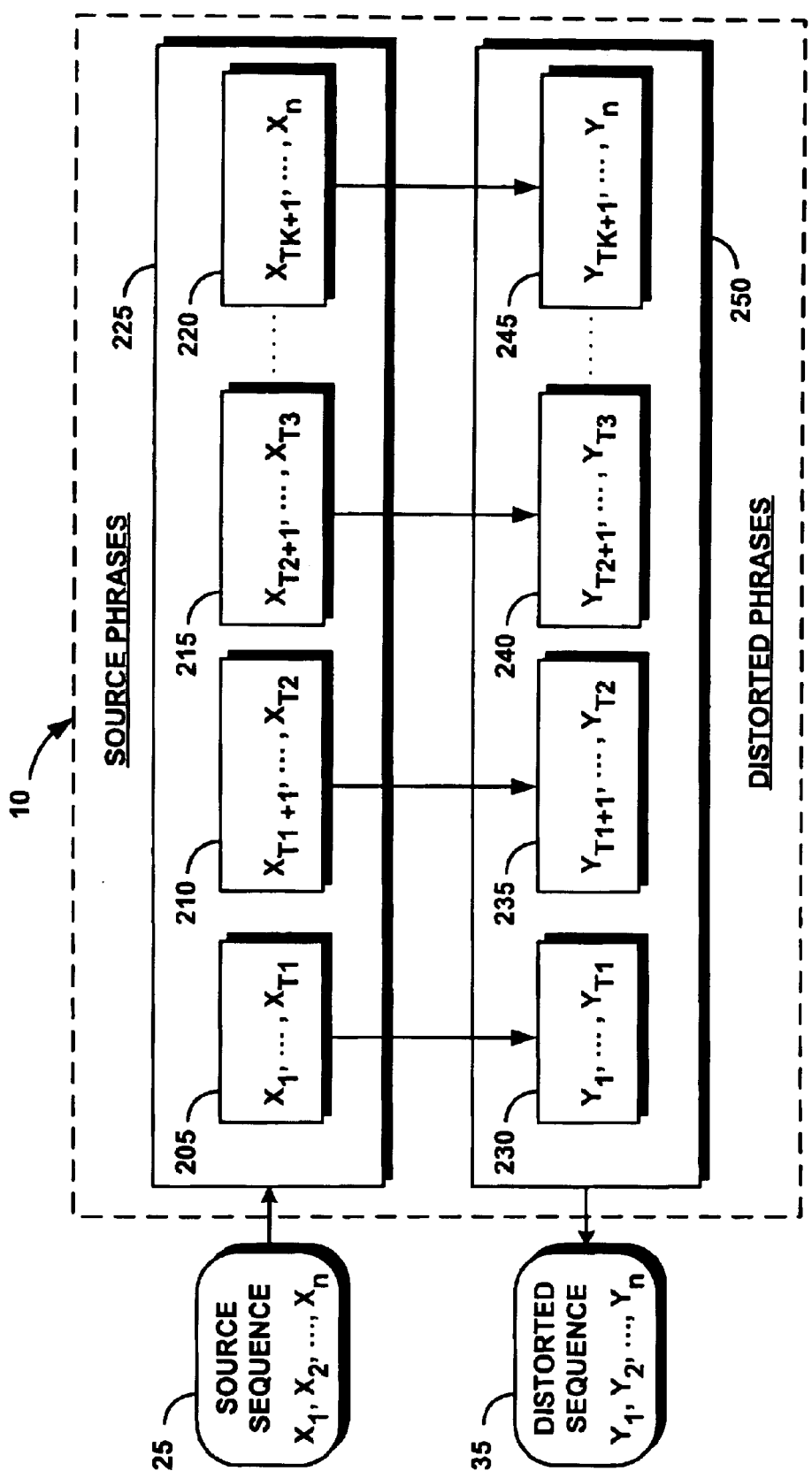
FIG. 2 is a block diagram that provides a high-level illustration of the operation of the lossy encoder of FIG. 1.

FIG. 2 provides a high-level illustration of the operation of the lossy encoder 10. Given the source sequence 25, encoder 10 parses the source sequence 25 sequentially into a sequence of source phrases 205, 210, 215, 220, as represented by source phrase block 225.

Encoder 10 maps each source phrase 205, 210, 215, 220 to a corresponding distorted phrase 230, 235, 240, 245, respectively, having the same length as the source phrase. The distorted phrases 230, 235, 240, 245 are represented by distorted phrase block 250. Each distorted phrase satisfies the average per-letter distortion constraint.

The average per-letter distortion between every source phrase in source phrase block 225 and its corresponding distorted phrase in distorted phrase block 250 does not exceed the desired distortion 30. It therefore follows that the average per-letter distortion between the source sequence 25 and the distorted sequence 35 does not exceed the desired distortion 30.

Encoder 10 synthesizes the distorted sequence 35 by concatenating the distorted phrases 230, 235, 240, 245. System 100 then compresses the distorted sequence 35 by means of the lossless encoder 15, using a known or available lossless code. For example, Lempel-Ziv algorithm (and its variants), Huffman coding, arithmetic coding, move-to-front encoding, etc. may be used. In a preferred embodiment, system 100 uses the Lempel-Ziv algorithm.

The selection of the source phrase, such as source phrase 215, for mapping to the distorted phrase, such as distorted phrase 240, is a salient aspect of encoder 10. Encoder 10 relies on an adaptive approach to determine the length of a source phrase, l, to select because the phrase length is variable.

To aid in finding the longest phrase length, l, that matches the source phrase, encoder 10 maintains a codebook. The codebook is a collection of phrases created by encoder 10. For the purpose of illustration, it is assumed that the reproduction alphabet is the standard Latin alphabet with 26 characters. For every previous distorted phrase "Y", encoder 10 will create 26 new phrases by adding each letter of the reproduction alphabet to the previous distorted phrase, one letter at a time. These new phrases are stored in the codebook. For example, if the previous distorted phrase is "230" and the standard Latin alphabet is the reproduction alphabet, encoder 10 adds the following phrases to the codebook: 230A.; 230B.; 230° C.; . . . 230Z.

The encoder 10 adaptively maintains a codebook as the set of all one-letter extensions of all previously emitted distorted phrases of distorted phrase block 250. Each phrase in the codebook is referred to as the codeword. Note that the codebook is a function of the previously emitted distorted phrases only, and not that of the previously emitted source phrases. This aspect of encoder 10 renders the encoding process more readily realizable since distorted phrases 250 will be available to the lossless decoder 20. In comparison, an encoding process that requires access to the source phrase block 225 is not realizable since the source phrases are not available to the lossless decoder 20.

Initially, the encoder 10 starts with a codebook that consists of all single symbols from the reproduction alphabet. After every new source phrase is processes, the codebook is updated by adding all single-letter extensions of the new distorted phrase to the codebook.

The encoder 10 maintains the codebook in a tree-structure such that the leaf nodes of the tree correspond to all the codewords and that the internal nodes of the tree correspond to all previously emitted distorted phrases.

Within the constraint of the desired distortion 30, encoder 10 finds the source phrase with the longest length, l, such that the resulting source phrase 215 matches one of the codewords in the codebook. Because the longest available phrase will provide the most compression, encoder 10 reviews all codewords in the codebook and selects the longest matching phrase within the distortion constraints.

In a preferred embodiment, encoder 10 initially sets the codebook to contain all of the single letter symbols in the reproduction alphabet. While the source sequence 25 is not exhausted, encoder 10 finds the longest prefix of the remaining source sequence 25 that matches at least one of the phrases in the codebook, without violating the per-letter distortion constraint 45.

Let p denote the of the longest length prefix of the unprocessed source sequence such that p matches at least codeword in the codebook within the desired distortion. Let "C" denote the collection of all code words of the same length as p that match p within the desired distortion 30. Encoder 10 selects one matching phrase from the many matching phrases in C, and outputs the selected phrase, q, as the new distorted phrase.

For every letter r in the reproduction alphabet, encoder 10 adds to the codebook the phrase formed by concatenating q with r. Encoder 10 then removes the phrase p from the source phrase block 225, and moves the pointer to the character after the last letter of the just processed source phrase.

Encoder 10 guarantees that each new distorted phrase is the longest phrase that is not one of the previous distorted phrases. In other terms, encoder 10 generates the distorted sequence 35 in the incremental parsing format corresponding to the lossless Lempel-Ziv algorithm.

To this end, encoder 10 organizes all the code words in the codebook in a tree structure, wherein each leaf of the tree represents a code word. As a result, encoder 10 is capable of performing a depth-first traversal of the code word tree. Encoder 10 then computes the average per letter distortion between every code word and the matching prefix. As a result of the tree structure, the entire operation can be carried out in a time that is proportional to the length of the source sequence that has been processed so far.

Figure 3:
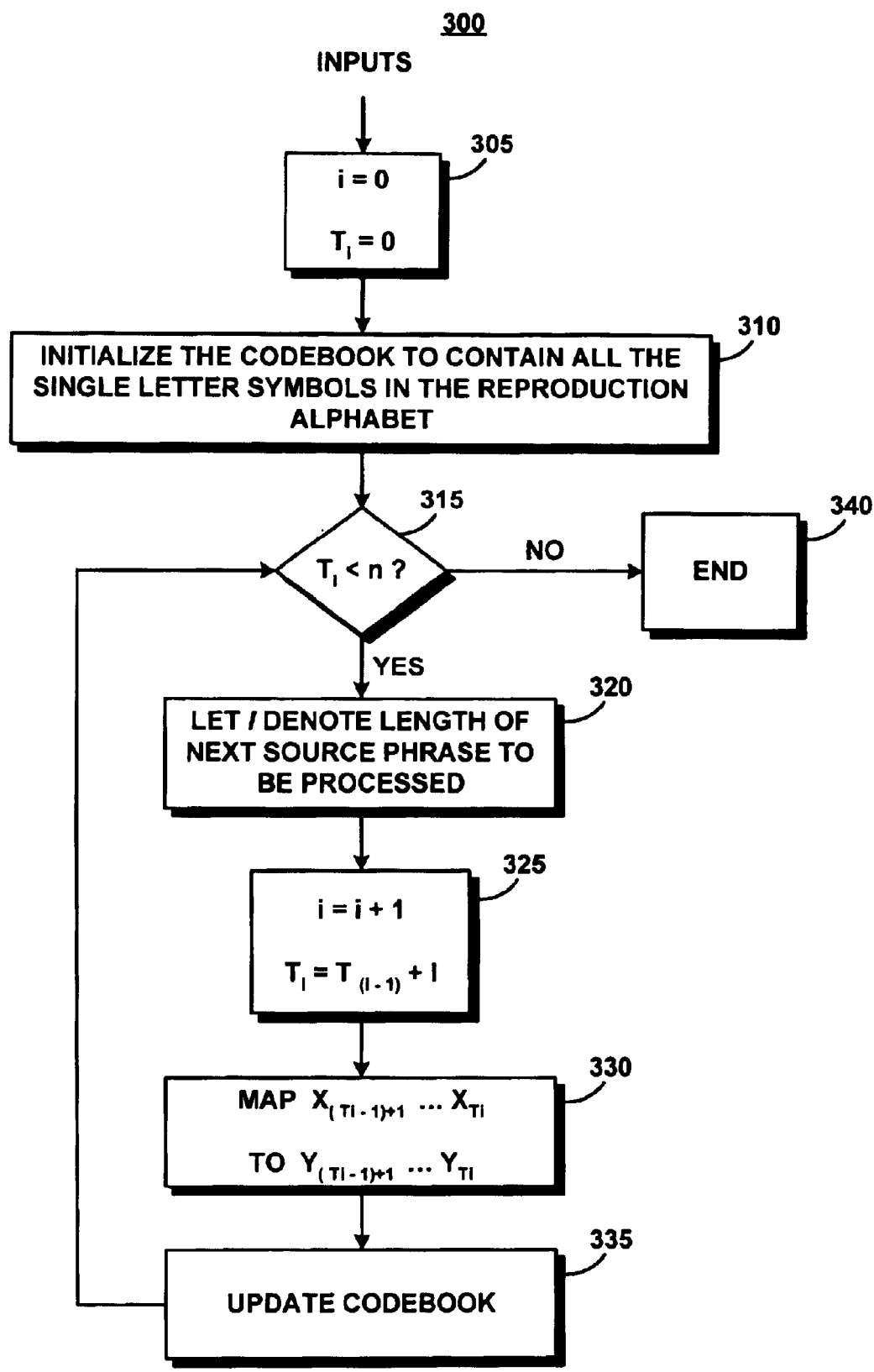
FIG. 3 is a process flow chart illustrating the operation of lossy encoder in the system of FIG. 1, according to the present invention.

The operation of encoder 10 is further illustrated by the method 300 of FIG. 3. At block 305, encoder 10 receives three inputs, the source sequence 25, the desired distortion 30 (or allowed distortion budget), and the average per-letter distortion 45. An iteration counter i and a processing location $T_i$ are both initialized to 0.

At block 310, encoder 10 initializes the codebook to contain all single symbols of the reproduction alphabet. Encoder 10 then checks the processing location $T_i$ within the source phrase at decision point 315. If processing location $T_i$ is less than the total length of the source sequence, n, unprocessed source symbols remain in the source sequence.

Encoder 10 then continues to process the source sequence, proceeding to block 320. At block 320, encoder 10 determines the length l of the next phrase to be processed. It is a feature of encoder 10 that that the length l is not fixed. Encoder 10 selects the length l to locate the longest possible remaining matching source sequence within the constraint of the desired distortion 30. By finding the longest possible matching phrase at each iteration, the encoder 10 is ensuring that the encoded phrase is highly compressible.

At block 325, encoder 10 increments the iteration counter i by 1 and also increments the processing location within the source string by the length l. Encoder 10 then maps source sequences $X_{(T_{i-1})+l}, \ldots, X_{T_i}$ to distorted sequences $Y_{(T_{i-1})+l}, \ldots, Y_{T_i}$ in block 330. The technique for mapping the source sequences to the distorted sequences in block 330 is another aspect of encoder 10.

Encoder 10 then updates the codebook at block 335 and returns to decision block 315 to check whether the processing location $T_i$ is within the source sequence. Encoder 10 repeats the steps at blocks 315 through 335 until the source sequence is exhausted. At that point, encoder 10 proceeds to step 340 and terminates.

Several methods exist for implementing the next step in the process, namely the choice of one distorted phrase from the multiplicity of distorted phrases that may match a given source phrase. This choice is an important aspect of the present invention. Of those methods, the following three specific techniques represent preferred embodiments.

In a first preferred embodiment, encoder 10 maintains an index for every code word in the codebook. This index is maintained for each added code word to specify when the corresponding code word was last used. Following the first iteration, any code words that have been added are marked with the index "1". Code words added after the second iteration are marked with the code word "2", and so forth.

From various multiple matches, encoder 10 selects the code word that was most-recently added to the codebook by choosing the phrase with the highest index. For the instances where more than one code word meets the "last used" criteria, encoder 10 judiciously selects only one of the candidate phrases. In this first embodiment, encoder 10 selects the phrase with the lowest distortion.

To describe the second and the third preferred embodiment for selecting one of many codewords that may match a given source phrase, we need to use an algorithm for lossless compression with side information. This algorithm will be used as a subroutine in encoder 10. A generic structure of such an algorithm is described in FIG. 4. Given a side information sequence V 405 and an unknown sequence U 410, encoder 415 wishes to send the unknown sequence U 410 from the encoder 415 to the decoder 420. The number of bits required to transmit the unknown sequence U 410 could be minimized by exploiting the common knowledge of the side information sequence V 405. Let $L(U|V)$ 425 denote the number of bits required to transmit the unknown sequence U 410 from the encoder 415 to the decoder 420 given that the side information sequence V 405 is available to both the encoder 415 and decoder 420.

Figure 4:
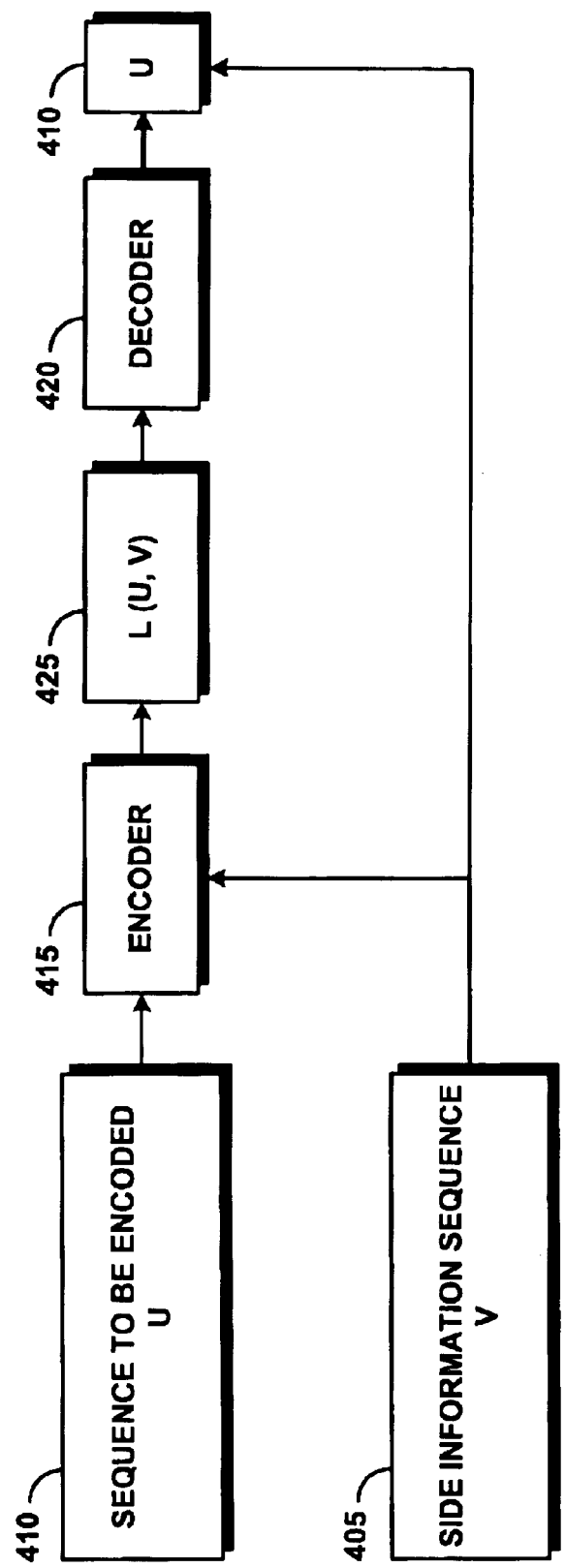
FIG. 4 is a block diagram illustrating computational steps of a generic algorithm for calculating the number of bits required to transmit a sequence U given a sequence V that may be used inside the lossy encoder FIG. 1.
Figure 5:
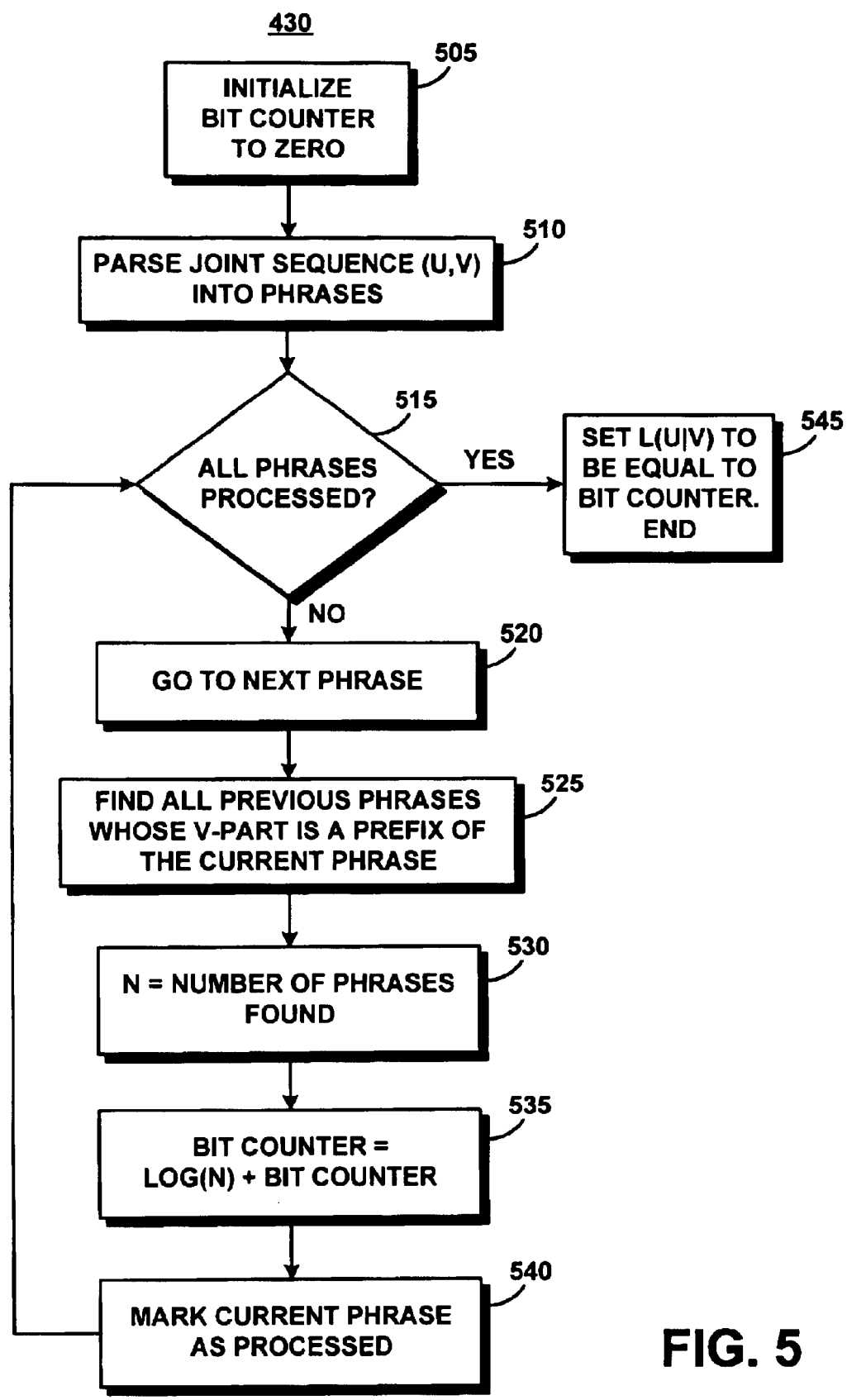
FIG. 5 is a process flow chart illustrating computational steps of a particular algorithm for calculating the number of bits required to transmit a sequence U given a sequence V.

Based on the Lempel-Ziv algorithm for compression with side information, FIG. 5 describes a method for computing $L(U|V)$ 425 in the preferred embodiment FIG. 4. At block 505 of method 430, the encoder 10 initializes the bit counter to zero, then parses the joint sequence (U,V) into phrases at block 510 using the Lempel-Ziv incremental parsing algorithm.

At decision block 515, the encoder 10 verifies whether all phrases the joint sequence (U,V) have been processed. If not, the encoder 10 proceeds to the next phrase at block 520. The encoder 10 examines the V-part of the phrase at block 525 then finds all previously processed phrases whose V-part is a prefix of the V-part of the current phrase.

At block 530, the encoder 10 sets N equal to the number of phrases found at block 525, then adds the logarithm of N to the bit counter at block 535. The encoder 10 marks the current phrase as processed at block 540 and returns to decision block 525. If all phrases have been processed, the encoder 10 proceeds to block 545 and terminates the procedure for computing the number of bits $L(U|V)$ 425 in transmitting the sequence U 415 given the side information sequence 405.

At the end of the procedure, the bit counter contains the number of bits $L(U|V)$ 425 required to encode the unknown sequence U 410 given the side information sequence V 405.

A second preferred method for step 430, choosing and mapping a distorted phrase from the multiplicity of distorted phrases that may match a given source phrase will now be described. Let x denote the entire source sequence 25 that has been processed so far (up to, but not including phrase p). Let y denote the entire distorted sequence 35 that has been output so far such that sequences x and y have the same length. Both sequences x and y are known by encoder 10. X is the concatenation of x with phrase p. For every phrase q' in the matching set C, the phrase Y(q') is the concatenation of y with phrase q'.

Encoder 10 computes sequence $L(X|Y(q'))$ for every phrase q' in the codebook. Next, encoder 10 selects phrase q that maximizes the sequence $L(X|Y(q))$ among all phrases in a matching set C, so that $L(X|Y(q))>L(X|Y(q'))$ for every phrase q' in the set C. In other terms, encoder 10 selects the phrase q from the matching set C such that the number of bits required to encode X given Y(q) using the Lempel-Ziv algorithm for lossless coding with side information is maximized.

A third preferred method for step 430, choosing and mapping a distorted phrase from the multiplicity of distorted phrases that may match a given source phrase will now be described. Let x denote the entire source sequence 25 that has been processed so far (up to, but not including phrase p). Let y denote the entire distorted sequence 35 that has been output so far such that sequences x and y have the same length. X is the concatenation of x with phrase p. For every phrase q' in the matching set C, Y(q') is the concatenation of y with phrase q'.

Encoder 10 computes sequence $L(X|Y(q'))-L(Y(q')|X)$ for every phrase q' in the codebook. Next, encoder 10 selects phrase q that maximizes the sequence $L(X|Y(q-))-L(Y(q)|X)$ among all phrases in the matching set C. In other terms, encoder 10 selects the phrase q from the matching set C such that the difference between the number of bits required to encode X given Y(q) and Y(q) given X using the Lempel-Ziv algorithm for lossless coding with side information is maximized.

Encoder 10 ensures that the reproduced sequence 40 is highly compressible by finding the longest phrase at every iteration. Encoder 10 then selects the distorted phrase among various competing phrases such that conditioned on it the source sequence 25 is the least typical. Such a choice improves the quality of the codebook for future compression, allowing encoder 10 to find even longer phrases in future iterations.

The process of the encoder 10 is completely sequential in that its encoding delay (in each iteration) vanishes as a function of the source sequence 25 compressed so far. In every iteration, this process uses previous distorted phrases as the codebook. In this sense, encoder 10 is adaptive. In addition, the entire procedure can be executed in quadratic-time by those skilled in the art of implementing algorithms.

Various refinements and extensions of the above algorithms can easily be implemented. Instead of maintaining a codebook of phrases, encoder 10 can simply search over the entire distorted sequence 35 output so far. This will make the distorted sequence 35 even more compressible, but will increase the complexity of the algorithm to cubic-time. In another embodiment, selected outdated phrases may be deleted from the codebook to reduce the amount of memory required for storing the codebook.

It is to be understood that the specific embodiments of the invention that have been described are merely illustrative of certain application of the principle of the present invention. Numerous modifications may be made to the polynomial-time, sequential, adaptive algorithm for lossy data compression invention described herein without departing from the spirit and scope of the present invention.

What is claimed is:

1. A lossy data compression method for converting a source sequence over a source alphabet to a distorted sequence over a reproduction alphabet by intentionally introducing errors, the method comprising:

parsing the source sequence into a plurality of source phrases;

mapping each source phrase to a distorted phrase of equal length and that includes a distortion that is less than an allowed per-symbol distortion budget; and synthesizing the distorted sequence by concatenating the distorted phrases.

2. The method of claim 1, wherein parsing the source sequence comprises parsing the source sequence sequentially into the source phrases, one phrase at a time, and mapping each source phrase to a distorted phrase before moving onto a next source phrase, until the source sequence is exhausted.

3. The method of claim 2, further comprising losslessly compressing each distorted phrase before the next source phrase is processed.

4. The method of claim 2, further comprising adaptively maintaining a codebook that includes a collection of codewords, in response to an observed source sequence, and updating the codebook after every source phrase has been processed.

5. The method of claim 4, wherein the codebook comprises all phrases that are obtained by extending all previously processed distorted phrases by all symbols of the reproduction alphabet.

6. The method of claim 5, further defining a new distorted phrase as a shortest phrase that is not the same as any of previously processed distorted phrases.

7. The method of claim 4, further defining a new source phrase as a prefix of an unprocessed source sequence that matches at least one codeword in the codebook within the allowed per-symbol distortion budget.

8. The method of claim 7, wherein each new source phrase is a longest prefix of the unprocessed source sequence that matches at least one codeword in the codebook within the allowed per-symbol distortion budget.

9. The method of claim 7, wherein mapping each source phrase comprises mopping the source phrase to a codeword in the codebook that matches the source phrase within the allowed per-symbol distortion budget.

10. The method of claim 9, wherein mapping each source phrase comprises mapping the source phrase to a codeword that has a smallest per-symbol distortion amongst all matching codewords.

11. The method of claim 9, wherein mapping each source phrase comprises mapping the source phrase to a codeword that is a most recent codeword amongst all matching codewords.

12. The method of claim 9, wherein mopping each source phrase comprises mapping the source phrase to a codeword amongst all matching codewords so as to maximize a number of bits required to encode on entire processed source sequence subject to an entire resulting processed distorted sequence as side information.

13. The method of claim 12, wherein computing the number of bits required to encode the entire processed source sequence subject to the entire resulting processed distorted sequence as side information comprises using a lossless compression code with a side information sequence.

14. The method of claim 13, wherein the lossless compression code with a side information sequence is a Lempel-Ziv code with side information.

15. The method of claim 13, wherein the lossless compression code with a side information sequence is an adoptive arithmetic code with side information.

16. The method of claim 13, wherein the lossless compression code with a side information sequence is a dynamic Huffman code with side information.

17. The method of claim 13, wherein the lossless compression code with a side information sequence is a Lempel-Ziv-Welch code with side information.

18. The method of claim 9, wherein mapping each source phrase comprises mapping the source phrase to a codeword amongst all matching codewords so that a difference between a number of bits required to encode an entire processed source sequence subject to an entire resulting processed distorted sequence as side information and the number of bits required to encode an entire resulting processed distorted sequence subject to an entire processed source sequence as side information is maximized.

19. The method of claim 18, wherein computing the number of bits required to encode the entire processed source sequence subject to the entire resulting processed distorted sequence as side information comprises using a lossless compression code with a side information sequence; and wherein computing the number of bits required to encode the entire resulting processed distorted sequence subject to the entire processed source sequence as side information comprises using a lossless compression code with a side information sequence.

20. The method of claim 19, wherein the lossless compression code with a side information sequence is a Lempel-Ziv code with side information.

21. The method of claim 19, wherein the lossless compression code with a side information sequence is an adaptive arithmetic code with side information.

22. The method of claim 19, wherein the lossless compression code with a side information sequence is an dynamic Huffman code with side information.

23. The method of claim 19, wherein the lossless compression code with a side information sequence is an Lempel-Ziv-Welch code with side information.

24. The method of claim 1, further comprising losslessly compressing the distorted sequence.

25. The method of claim 24, further comprising decompressing the compressed distorted sequence.

26. The method of claim 25, wherein losslessly compressing and decompressing the distorted sequence comprises using a Lempel-Ziv code.

27. The method of claim 25, wherein losslessly compressing and decompressing the distorted sequence comprises using an adaptive arithmetic code.

28. The method of claim 25, wherein losslessly compressing and decompressing the distorted sequence comprises using a Lempel-Ziv-Welch code.

29. The method of claim 25, wherein losslessly compressing and decompressing the distorted sequence comprises using a dynamic Huffman code.

30. The method of claim 25, wherein losslessly compressing and decompressing the distorted sequence comprises using a locally adaptive move-to-front code.

31. A computer program product having instruction codes for converting a source sequence over a source alphabet to a distorted sequence over a reproduction alphabet by intentionally introducing errors, the computer program product comprising:
 a first set of instruction codes for parsing the source sequence into a plurality of source phrases;
 a second set of instruction codes for mapping each source phrase to a distorted phrase of equal length and that includes a distortion that is less than an allowed per-symbol distortion budget; and
 a third set of instruction codes for synthesizing the distorted sequence by concatenating the distorted phrases.

32. The computer program product of claim 31, wherein the first set of instruction codes for parsing the source sequence parses the source sequence sequentially into the source phrases, one phrase at a time, and maps each source phrase to a distorted phrase before moving onto a next source phrase, until the source sequence is exhausted.

33. The computer program product of claim 32, further comprising a fourth set of instruction codes for losslessly compressing each distorted phrase before the next source phrase is processed.

34. The computer program product of claim 33, further comprising a fifth set of instruction codes for adaptively maintaining a codebook that includes a collection of codewords, in response to on observed source sequence, and for updating the codebook after every source phrase has been processed.

35. The computer program product of claim 34, wherein the codebook comprises all phrases that are obtained by extending all previously processed distorted phrases by all symbols of the reproduction alphabet.

36. The computer program product of claim 35, wherein a new distorted phrase is a shortest phrase that is not the same as any of previously processed distorted phrases.

37. The computer program product of claim 34, wherein a new source phrase is a prefix of an unprocessed source sequence that matches at least one codeword in the codebook within the allowed per-symbol distortion budget.

38. The computer program product of claim 37, wherein each new source phrase is a longest prefix of the unprocessed source sequence that matches at least one codeword in the codebook within the allowed per-symbol distortion budget.

39. The computer program product of claim 37, wherein the second set of instruction codes maps the source phrase to a codeword in the codebook that matches the source phrase within the allowed per-symbol distortion budget.

40. The computer program product of claim 39, wherein the second set of instruction codes maps the source phrase to the codeword that has a smallest per-symbol distortion amongst all matching codewords.

41. The computer program product of claim 39, wherein the second set of instruction codes maps the source phrase to the codeword that is a most recent codeword amongst all matching codewords.

42. The computer program product of claim 39, wherein the second set of instruction codes maps the source phrase to a codeword amongst all matching Codewords so as to maximize a number of bits required to encode an entire processed source sequence subject to an entire resulting processed distorted sequence as side information.

43. The computer program product of claim 42, wherein the second set of instruction codes computes the number of bits required to encode the entire processed source sequence subject to the entire resulting processed distorted sequence as side information using a lossless compression code with a side information sequence.

44. The computer program product of claim 43, wherein the lossless compression code with a side information sequence is a Lempel-Ziv code with side information.

45. The computer program product of claim 43, wherein the lossless compression code with a side information sequence is an adaptive arithmetic code with side information.

46. The computer program product of claim 43, wherein the lossless compression code with a side information sequence is a dynamic Huffman code with side information.

47. The computer program product of claim 43, wherein the lossless compression code with a side information sequence is a Lempel-Ziv-Welch code with side information.

48. The computer program product of claim 39, wherein the second set of instruction codes maps the source phrase to a codeword amongst all matching codewords so that a difference between a number of bits required to encode an entire processed source sequence subject to an entire resulting processed distorted sequence as side information and the number of bits required to encode an entire resulting processed distorted sequence subject to an entire processed source sequence as side information is maximized.

49. The computer program product of claim 48, wherein the second set of instruction codes computes the number of bits required to encode the entire processed source sequence subject to the entire resulting processed distorted sequence as side information using a lossless compression code with a side information sequence; and
 wherein the second set of instruction codes further computes the number of bits required to encode the entire resulting processed distorted sequence subject to the entire processed source sequence as side information using a lossless compression code with a side information sequence.

50. The computer program product of claim 33, wherein the fourth set of instruction codes losslessly compresses the distorted sequence, and further decompresses the compressed distorted sequence.

51. A system for converting a source sequence over a source alphabet to a distorted sequence over a reproduction alphabet by intentionally introducing errors, the system comprising:
 means for parsing the source sequence into a plurality of source phrases;

means for mapping each source phrase to a distorted phrase of equal length and that includes a distortion that is less than an allowed per-symbol distortion budget; and means for synthesizing the distorted sequence by concatenating the distorted phrases.

52. The system of claim 51, wherein the parsing means parses the source sequence sequentially into the source phrases, one phrase at a time, and maps each source phrase to a distorted phrase before moving onto a next source phrase, until the source sequence is exhausted.

53. The system of claim 52, further comprising means for losslessly compressing each distorted phrase before the next source phrase is processed.

54. The system of claim 53, further comprising means for adaptively maintaining a codebook that includes a collection of codewords, in response to an observed source sequence, and for updating the codebook after every source phrase has been processed.

55. The system of claim 54, wherein the codebook comprises all phrases that ore obtained by extending all previously processed distorted phrases by all symbols of the reproduction alphabet;

wherein a new distorted phrase is a shortest phrase that is not the same as any of previously processed distorted phrases;

wherein a new source phrase is a prefix of an unprocessed source sequence that matches at least one codeword in the codebook within the allowed per-symbol distortion budget; and wherein each new source phrase is a longest prefix of the unprocessed source sequence that matches at least one codeword in the codebook within the allowed per-symbol distortion budget.

56. The system of claim 55, wherein the mapping means maps the source phrase to a codeword in the codebook that matches the source phrase within the allowed per-symbol distortion budget;

wherein the mapping means further maps the source phrase to the codeword that has a smallest per-symbol distortion amongst all matching codewords; wherein the mapping means further maps the source phrase to the codeword that is a most recent codeword amongst all matching codewords;

wherein the mapping means further maps the source phrase to a codeword amongst all matching codewords so as to maximize a number of bits required to encode an entire processed source sequence subject to an entire resulting processed distorted sequence as side information; and wherein the mapping means further computes the number of bits required to encode an entire processed source sequence subject to the entire resulting processed distorted sequence as side information using a lossless compression code with a side information sequence.

57. The system of claim 56, wherein the lossless compression code with a side information sequence is any one of:

a Lempel-Ziv code with side information;

an adaptive arithmetic code with side information;

a dynamic Huffman code with side information; or a Lempel-Ziv-Welch code with side information.

58. The system of claim 56, wherein the mapping means maps the source phrase to a codeword amongst all matching codewords so that a difference between the number of bits required to encode the entire processed source sequence subject to an entire resulting processed distorted sequence as side information and the number of bits required to encode an entire resulting processed distorted sequence subject to an entire processed source sequence as side information is maximized.

59. The system of claim 58, wherein the mapping means computes the number of bits required to encode the entire processed source sequence subject to the entire resulting processed distorted sequence as side information using a lossless compression code with a side information sequence; and wherein the mapping means further computes the number of bits required to encode the entire resulting processed distorted sequence subject to the entire processed source sequence as side information using a lossless compression code with a side information sequence.

60. The system of claim 53, wherein the means losslessly compressing compresses the distorted sequence, and further decompresses the compressed distorted sequence.

* * * * *

UNITED STATES PATENT AND TRADEMARK OFFICE
CERTIFICATE OF CORRECTION

PATENT NO. : 6,798,362 B2
DATED : September 28, 2004
INVENTOR(S) : Dharmendra Shantilal Modha It is certified that error appears in the above-identified patent and that said Letters Patent is hereby corrected as shown below:

Column 10,
Lines 4 and 14, please replace "mopping" with -- mapping --;
Line 17, please replace "on" with -- an --;
Lines 18-19, please replace "adoptive" with -- adaptive --;

Column 11,
Line 47, please replace "on" with -- an --;

Column 12,
Line 13, please replace "Codewords" with -- codewords --; and

Column 13,
Line 21, please replace "ore" with -- are --.

Signed and Sealed this

Nineteenth Day of April, 2005

JON W. DUDAS
*Director of the United States Patent and Trademark Office*